(12) United States Patent
Oshiki et al.

(10) Patent No.: US 8,377,732 B2
(45) Date of Patent: Feb. 19, 2013

(54) METHOD OF MANUFACTURING BACK SIDE ILLUMINATED IMAGING DEVICE

(75) Inventors: Yusuke Oshiki, Yokohama (JP); Kiyotaka Miyano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/887,351

(22) Filed: Sep. 21, 2010

(65) Prior Publication Data

US 2011/0159634 A1    Jun. 30, 2011

(30) Foreign Application Priority Data

Dec. 24, 2009 (JP) ................................ 2009-292080

(51) Int. Cl.
*H01L 21/00* (2006.01)
(52) U.S. Cl. .... 438/69; 438/455; 438/458; 257/E31.127
(58) Field of Classification Search ............... 438/69, 438/455, 458; 257/E31.127
See application file for complete search history.

(56) References Cited

U.S. PATENT DOCUMENTS

| | | | |
|---|---|---|---|
| 5,254,484 A * | 10/1993 | Hefner et al. ............... | 438/515 |
| 6,168,965 B1 | 1/2001 | Malinovich et al. | |
| 6,172,322 B1 * | 1/2001 | Shang et al. ............. | 219/121.43 |
| 6,569,717 B1 * | 5/2003 | Murade ..................... | 438/149 |
| 2008/0197436 A1 * | 8/2008 | Uya .......................... | 257/432 |
| 2009/0184399 A1 | 7/2009 | Kowalski et al. | |
| 2010/0059843 A1 * | 3/2010 | Ikuta et al. ................ | 257/432 |
| 2010/0090303 A1 * | 4/2010 | Takizawa ................... | 257/432 |

FOREIGN PATENT DOCUMENTS

JP    2009-111118    5/2009

* cited by examiner

*Primary Examiner* — Julia Slutsker
(74) *Attorney, Agent, or Firm* — Finnegan, Henderson, Farabow, Garrett & Dunner, L.L.P.

(57) ABSTRACT

In one embodiment, a method of manufacturing a back side illuminated imaging device includes forming a semiconductor detection device and a peripheral circuit device on a semiconductor substrate, and bonding the semiconductor substrate onto a holding substrate via the semiconductor detection device and the peripheral circuit device. The method further includes removing the semiconductor substrate from the holding substrate to transfer the semiconductor detection device and the peripheral circuit device onto the holding substrate. The method further includes forming an amorphous semiconductor layer in which impurities are introduced, on the semiconductor detection device transferred onto the holding substrate, and annealing the amorphous semiconductor layer by using a microwave.

20 Claims, 3 Drawing Sheets

METHOD OF MANUFACTURING BACK SIDE ILLUMINATED IMAGING DEVICE

CROSS REFERENCE TO RELATED APPLICATION

This application is based upon and claims the benefit of priority from the prior Japanese Patent Application No. 2009-292080, filed on Dec. 24, 2009, the entire contents of which are incorporated herein by reference.

FIELD

Embodiments described herein relate to a method of manufacturing a back side illuminated imaging device, for example, for manufacturing a back side illuminated CMOS (complementary metal oxide semiconductor) image sensor.

BACKGROUND

In general, a CMOS image sensor is manufactured by bonding a CMOS device made of silicon to a protective frame made of ceramic material and the like with an adhesive, and then electrically connecting the CMOS device to the protective frame. The CMOS device is fabricated by forming a photodiode as a semiconductor detection part, a charge coupled type transfer part including poly-silicon electrodes, an FET (field effect transistor) as a charge read-out part and the like on a semiconductor substrate by typical semiconductor processes.

The CMOS image sensor has a problem that when energy rays such as light and electrons are applied from the front surface side, the energy rays are prevented from the incidence by the electrodes and the like, which makes it impossible to obtain a sufficient sensitivity to extremely weak energy rays.

To solve this problem, a method of applying the energy rays from the back surface side is adopted in some of CMOS image sensors. In this case, the thickness of the semiconductor substrate on the photodiode on the back surface side is reduced to about 20 µm by a chemical etching while its peripheral portion is caused to remain. This enables signal charges generated by the energy rays applied from the back surface side to be read. This method makes it possible to suppress a reduction in detection sensitivity to the energy rays due to the electrodes and the like.

In the surface layer of a photo-detection part in the back side illuminated CMOS image sensor, a p+ type semiconductor layer (hereinafter referred to as a "p+ layer") needs to be formed as an inversion layer for increasing a photosensitivity to the wavelength of each light and for preventing a signal color mixture between adjacent photodiodes. When the p+ layer is formed, a heat treatment for activating the p+ layer is necessary. However, in a conventional heat treatment method, there is a problem that the entire device is heated during the heat treatment for the activation of the p+ layer, which causes an adverse impact on the peripheral circuit device.

Note that JP-A 2009-111118 (KOKAI) discloses an example of a method of manufacturing a back side illuminated imaging device, the method including steps of forming a first pixel separation region by introducing impurities into a semiconductor substrate, forming a first epitaxial growth layer on a surface of the semiconductor substrate, forming a second pixel separation region so that the second pixel separation region penetrates the first epitaxial growth layer to contact with the first pixel separation region, and forming a photoelectric conversion part and a peripheral circuit part within the semiconductor substrate defined by the first and second pixel separation regions. The first and second pixel separation regions are formed, for example, by an ion implantation process and an activation annealing process.

DETAILED DESCRIPTION

Figure 1A:
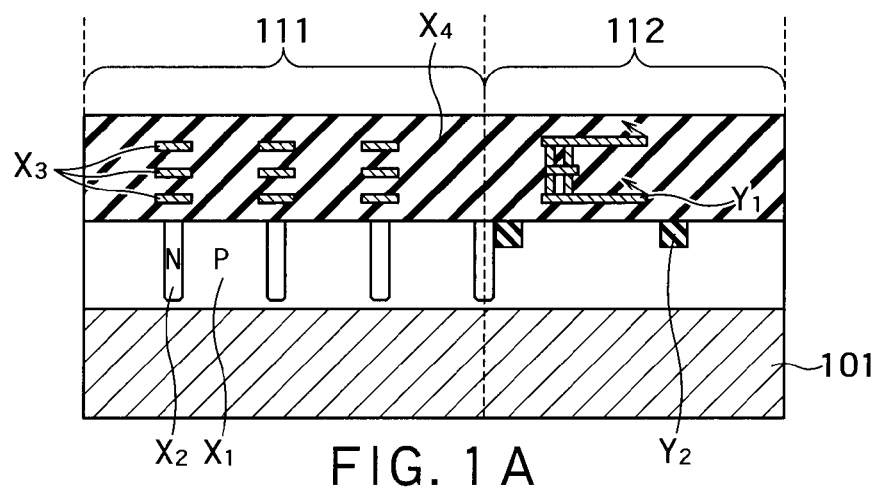
FIGS. 1A to 2C are cross-sectional side views for explaining a method of manufacturing a back side illuminated CMOS image sensor of a first embodiment.

Embodiments will now be explained with reference to the accompanying drawings.

An embodiment described herein is, for example, a method of manufacturing a back side illuminated imaging device, the method including forming a semiconductor detection device and a peripheral circuit device on a semiconductor substrate, and bonding the semiconductor substrate onto a holding substrate via the semiconductor detection device and the peripheral circuit device. The method further includes removing the semiconductor substrate from the holding substrate to transfer the semiconductor detection device and the peripheral circuit device onto the holding substrate. The method further includes forming an amorphous semiconductor layer in which impurities are introduced, on the semiconductor detection device transferred onto the holding substrate, and annealing the amorphous semiconductor layer by using a microwave.

Another embodiment described herein is, for example, a method of manufacturing a back side illuminated imaging device, the method including forming a semiconductor detection device and a peripheral circuit device on a semiconductor substrate, and forming an amorphous semiconductor layer in which impurities are introduced, on the semiconductor detection device formed on the semiconductor substrate. The method further includes annealing the amorphous semiconductor layer by using a microwave.

In the drawings, the same or similar components are denoted by the same or similar reference characters. However, the drawings are illustrative, and the relationships between planar dimensions and thicknesses, thickness ratios among layers and the like are different from actual ones. In the following embodiments, the case of manufacturing a back side illuminated imaging device using typical processes is described by way of example. However, the disclosure is not limited to the method to be described below, such as the order in which processes are performed.

(First Embodiment)

FIGS. 1A to 2C are cross-sectional side views for explaining a method of manufacturing a back side illuminated CMOS image sensor of a first embodiment. FIGS. 1A to 2C show partial cross sections of the back side illuminated CMOS image sensor manufactured by the method.

First, as shown in FIG. 1A, a semiconductor detection device 111 including a photodiode device and the like, and an image peripheral circuit device 112 including an FET (field effect transistor) device and the like are formed on a semiconductor substrate 101 by a conventional method. In the present embodiment, the semiconductor substrate 101 is a silicon substrate (silicon wafer), and the semiconductor detection device 111 as is a photo-detection device.

FIG. 1A shows a p-type semiconductor layer $X_1$ formed on the semiconductor substrate 101, and an n-type semiconductor layer $X_2$ formed on the (inner) surface of the p-type semiconductor layer $X_1$. The photodiode of the semiconductor detection device 111 is made of these semiconductor layers. FIG. 1A further shows interconnect layers $X_3$ of the semiconductor detection device 111, and an interconnect layer $Y_1$ of the peripheral circuit device 112 including a gate electrode, a plug layer, a metal interconnect layer and the like. FIG. 1A further shows an inter layer dielectric $X_4$ covering the semiconductor detection device 111 and the peripheral circuit device 112, and isolation insulators $Y_2$ for the peripheral circuit device 112.

Figure 1B:
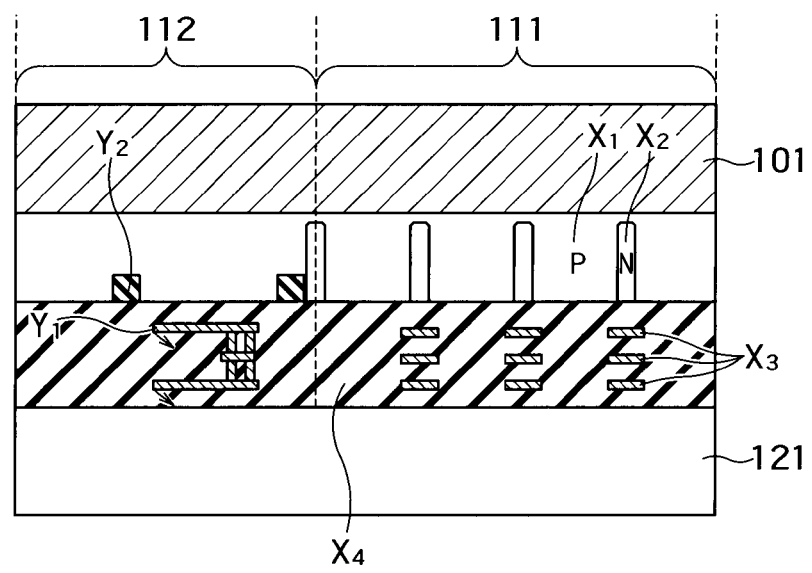

Next, the semiconductor substrate 101 is divided along a plane. Subsequently, as shown in FIG. 1B, the semiconductor substrate 101 is reversed, and the reversed semiconductor substrate 101 is bonded via the semiconductor detection device 111 and the peripheral circuit device 112 onto a holding substrate 121. As a material of the holding substrate 121 and an adhesive for bonding the semiconductor substrate 101, conventional materials and adhesives are usable. The semiconductor substrate 101 is divided along a predetermined plane which is parallel to the substrate surface of the semiconductor substrate 101.

Figure 1C:
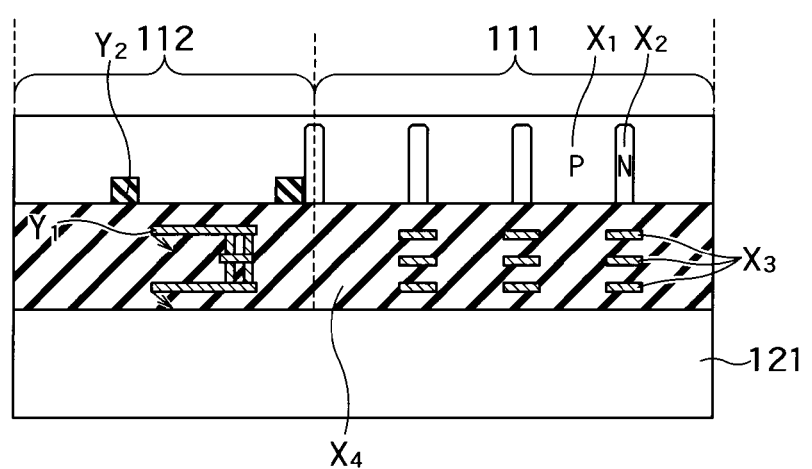

Next, as shown in FIG. 1C, the semiconductor substrate 101 is removed from the holding substrate 121 by etching, so that the semiconductor detection device 111 and the peripheral circuit device 112 are transferred onto the holding substrate 121. At this point, the semiconductor substrate 101 may be not completely removed, i.e., the semiconductor substrate 101 may partially remain on the holding substrate 121.

Figure 2A:
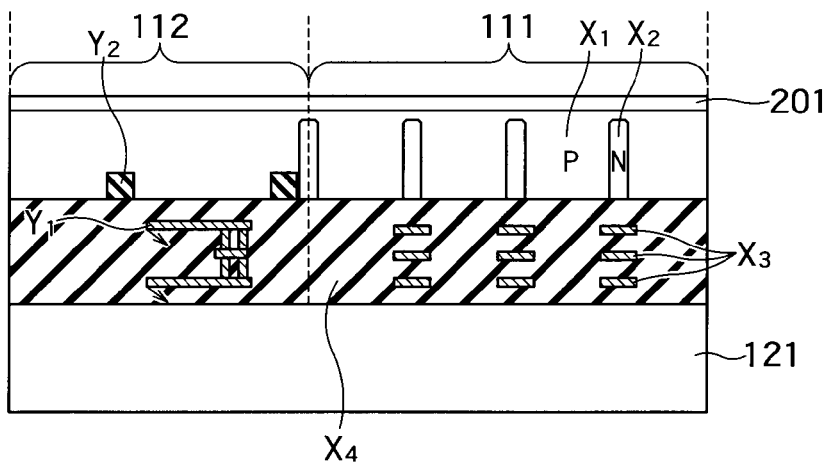

Next, as shown in FIG. 2A, an amorphous semiconductor layer 201 in which impurities are introduced is deposited on the semiconductor detection device 111 transferred onto the holding substrate 121 and exposed on the surface of the holding substrate 121. In the present embodiment, the amorphous semiconductor layer 201 is an amorphous silicon layer, and the impurities are B (boron) atoms. The thickness of the amorphous semiconductor layer 201 is in the range from 15 to 25 nm, for example, 20 nm, and the area concentration of B (boron) is in the range from $1 \times 10^{18}$ to $1 \times 10^{20}$ cm$^{-2}$, for example, $1 \times 10^{19}$ cm$^{-2}$.

Figure 2B:
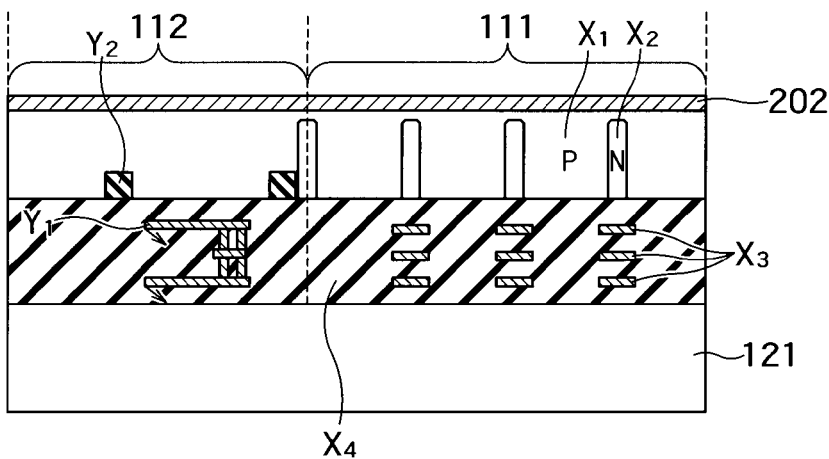

Next, in the present embodiment, the amorphous semiconductor layer 201 is annealed at a temperature of 520° C. by using a microwave. This activates and crystallizes the amorphous semiconductor layer 201, so that a p+ type semiconductor layer 202 is formed from the amorphous semiconductor layer 201 as shown in FIG. 2B. The p+ type semiconductor layer 202 is formed on a light incident surface of the semiconductor detection device (photodiode) 111. In the present embodiment, the frequency of the microwave is set to 5.8 GHz, and the annealing is performed for 20 minutes. The crystallization rate of the amorphous semiconductor layer 201 in the present embodiment is, for example, about 1 μm in 30 minutes.

As described above, a heat treatment for activating the p+ type semiconductor layer 202 is needed when the p+ type semiconductor layer 202 is formed. In a conventional heat treatment method, however, the entire device is heated during the heat treatment for activating the p+ type semiconductor layer 202, which causes an adverse impact on the peripheral circuit device 112 such as a lead transistor. For example, an adverse impact due to a diffusion of the impurities is exerted on the peripheral circuit device 112.

To overcome this disadvantage, in the present embodiment, a heat treatment for activation, i.e., an annealing, is performed by using a microwave. The microwave annealing has an advantage that the activation can be performed at a relatively low temperature. Accordingly, in the present embodiment, by using the microwave annealing technique which allows the activation at the low temperature, the p+ type semiconductor layer 202 can be formed on the semiconductor detection device 111 while reducing the impact by the diffusion of the impurities or the like on the peripheral circuit device 112. In addition, in the present embodiment, this microwave annealing technique makes it possible to form the excellently crystallized and activated p+ type semiconductor layer 202 with relative ease.

The temperature of the annealing is not limited to 520° C., and may be any temperature at which the amorphous semiconductor layer 201 is activated and at which the diffusion of the impurities within the amorphous semiconductor layer 201 does not become problematic. It is desirable that the temperature of the annealing be set, for example, in the range from 250 to 700° C. This is because the activation often does not occur at a temperature lower than 250° C., whereas the diffusion of the impurities often becomes problematic at a temperature higher than 700° C. In the present embodiment, the annealing at the temperature within the range from 250 to 700° C. enables the p+ type semiconductor layer 202 to be activated while avoiding the problem of the impurity diffusion, in many cases. The time of the annealing is not limited to 20 minutes, and is set in the range from 5 to 60 minutes in the present embodiment.

The microwave is defined as an electromagnetic wave having a frequency ranging from 300 MHz to 3 THz (i.e., having a wavelength ranging from 100 μm to 1 m).

The frequency of the microwave for the annealing is not limited to 5.8 GHz, and may be set to other values. Regarding the frequency of the microwave, 2.45 GHz, 5.80 MHz and 24.125 GHz are specified as bands for industrial, scientific, and medical use (ISM). For the microwaves of these frequencies, a magnetron and the like for generating these microwaves are available at low cost. Therefore, it is desirable that the frequency of the microwave for the annealing be set, for example, in the range from 2.45 to 24.125 GHz.

The frequency of 5.8 GHz of the microwave is the most suitable frequency to heat silicon. Therefore, in cases where the p+ type semiconductor layer 202 is a silicon layer, it is preferable that the frequency of the microwave be set near 5.8 GHz. In the present embodiment, the frequency of the microwave is set, for example, in the range from 3 to 8 GHz. This enables the heating efficiency of the p+ type semiconductor layer 202 to be satisfactory.

Note that in cases where the p+ type semiconductor layer 202 is a semiconductor layer other than the silicon layer, the frequency most suitable for the semiconductor layer is not much different from that for the silicon layer, and therefore the frequency in the range from 3 to 8 GHz is also effective for heating the p+ type semiconductor layer 202 other than the silicon layer.

Figure 2C:
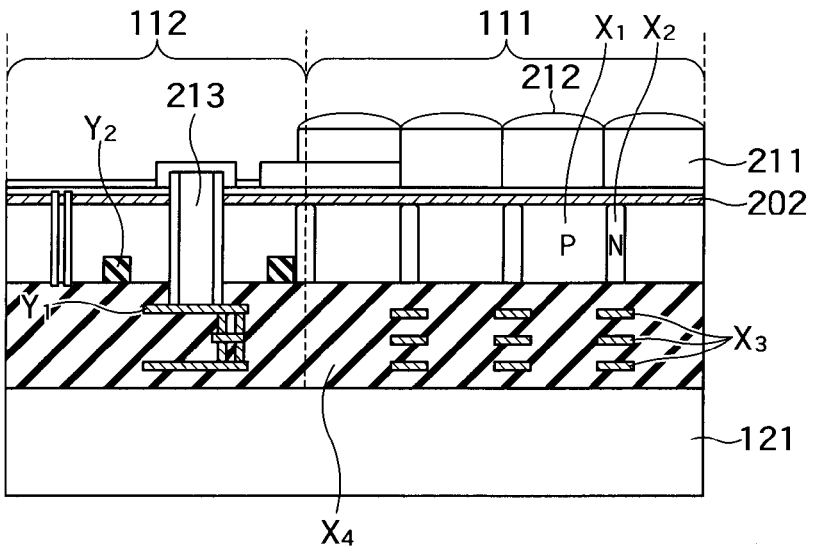

Thereafter in the present embodiment, as shown in FIG. 2C, color filters 211 and condenser lenses 212 are fabricated on the light incident surface of the semiconductor detection device (photodiode) 111 via the p+ type semiconductor layer 202. Further, a contact is formed on the interconnect layer $Y_1$ of the peripheral circuit device 112, so that the peripheral circuit device 112 and a metal interconnect 213 are electrically connected so as to extract a signal to the outside. In this way, the back side illuminated CMOS image sensor is manufactured.

As described above, in the present embodiment, the amorphous semiconductor layer 201 is annealed by using the microwave to form the p+ type semiconductor layer (impurity semiconductor layer) 202. Consequently, in the present embodiment, it is possible to form the p+ type semiconductor layer 202 on the semiconductor detection device 111 by the activation heat treatment while reducing the impact on the peripheral circuit device 112.

While the CMOS image sensor has been described as an example of the back side illuminated imaging device of the present embodiment, the disclosure is not limited to the CMOS image sensor. Another example of the back side illuminated imaging device of the present embodiment includes a CCD (charge coupled device) image sensor.

The manufacturing method of the present embodiment is not limited to the manufacturing of the back side illuminated imaging device, and is applicable to a manufacturing of a front side illuminated imaging device.

The manufacturing method of the present embodiment includes forming the semiconductor detection device 111 and the peripheral circuit device 112 on the semiconductor substrate 101 (FIG. 1A), transferring the semiconductor detection device 111 and the peripheral circuit device 112 onto the holding substrate 121 (FIG. 1C), and forming the amorphous semiconductor layer 201 on the semiconductor detection device 111 transferred onto the holding substrate 121 (FIG. 2A).

However, the manufacturing method of the present embodiment may include forming the semiconductor detection device 111 and the peripheral circuit device 112 on the semiconductor substrate 101 to form the structure where the holding substrate 121 in FIG. 1C is replaced by the semiconductor substrate 101, and then forming the amorphous semiconductor layer 201 on the semiconductor detection device 111 formed on the semiconductor substrate 101. Consequently, a back side illuminated CMOS image sensor similar to that in FIG. 2C can be formed without the transfer process of the semiconductor detection device 111 and the peripheral circuit device 112.

The structure where the holding substrate 121 in FIG. 1C is replaced by the semiconductor substrate 101 can be formed, for example, by forming the inter layer dielectric $X_4$, the interconnect layers $X_3$, and the interconnect layer $Y_1$ on the semiconductor substrate 101, and then forming the isolation insulators $Y_2$, the p-type semiconductor layer $X_1$, and the n-type semiconductor layer $X_2$ via the inter layer dielectric $X_4$ on the semiconductor substrate 101.

A second embodiment of the disclosure is described below. Since the second embodiment is a modification of the first embodiment, differences from the first embodiment are mainly described for the second embodiment.

(Second Embodiment)

Figure 3A:
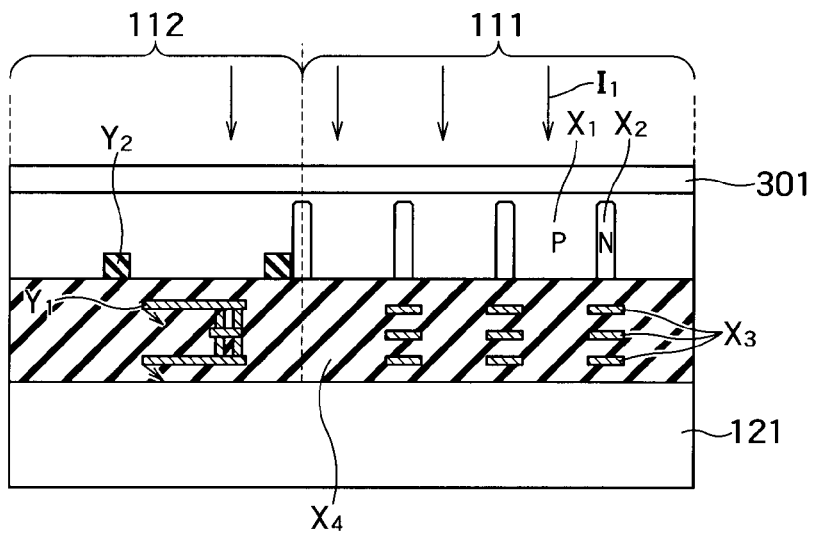
FIGS. 3A to 3C are cross-sectional side views for explaining a method of manufacturing a back side illuminated CMOS image sensor of a second embodiment.
Figure 3B:
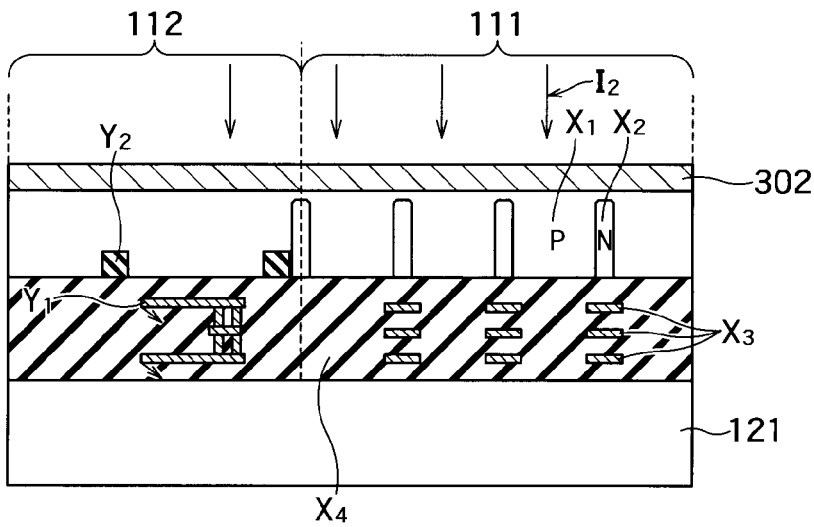
Figure 3C:
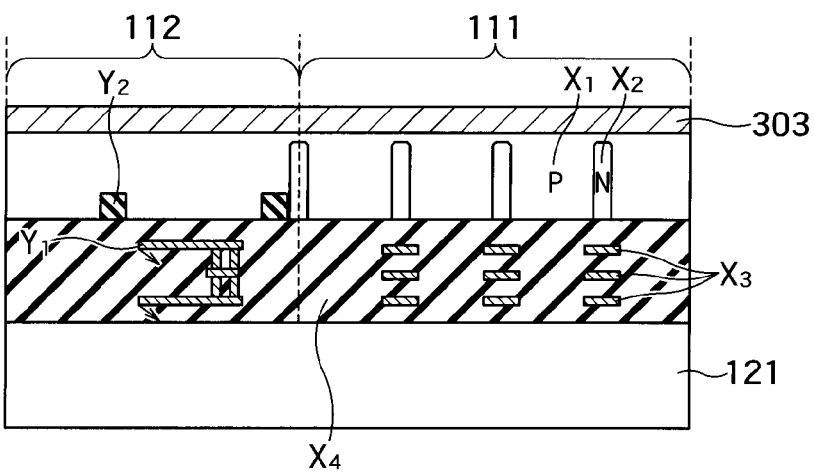

FIGS. 3A to 3C are cross-sectional side views for explaining a method of manufacturing a back side illuminated CMOS image sensor of a second embodiment. FIGS. 3A to 3C show partial cross sections of the back side illuminated CMOS image sensor manufactured by the method.

First, similarly to the first embodiment, the semiconductor detection device 111 and the peripheral circuit device 112 are transferred onto the holding substrate 121 by the processes shown in FIGS. 1A to 1C.

Next, as shown in FIG. 3A, a non-amorphous semiconductor layer 301 is deposited on the semiconductor detection device 111 transferred onto the holding substrate 121 and exposed on the surface of the holding substrate 121. In the present embodiment, the semiconductor layer 301 is a non-amorphous silicon layer.

Next, as indicated by arrows $I_1$ in FIG. 3A, an ion implantation into the semiconductor layer 301 is performed. The ion implantation is performed to partially or entirely amorphize the semiconductor layer 301. The ion implantation is a pre-amorphization implantation (PAI), and corresponds to an example of a first ion implantation of the disclosure. The ion implantation causes the semiconductor layer 301 to be amorphized to form an amorphous semiconductor layer 302 from the semiconductor layer 301 as shown in FIG. 3B.

In the present embodiment, atoms used for the ion implantation $I_1$ are Ge (germanium) atoms, and the ion implantation $I_1$ is performed under the conditions of 30 keV and $1\times10^{16}$ cm$^{-2}$. As the atoms for the ion implantation $I_1$, other atoms which enable the amorphization of the semiconductor layer 301 may be used. For example, Sn (tin) atoms or Sb (antimony) atoms may be used as the atoms for the ion implantation Next, as indicated by arrows $I_2$ in FIG. 3B, an ion implantation into the amorphous semiconductor layer 302 is performed. The ion implantation is performed to introduce impurities into the amorphous semiconductor layer 302, and corresponds to an example of a second ion implantation of the disclosure. In FIG. 3C, the amorphous semiconductor layer 302 into which the impurities are introduced is denoted by reference numeral 303.

In the present embodiment, atoms used for the ion implantation $I_2$ are B (boron) atoms, and the ion implantation $I_2$ is performed under the conditions of 5 keV and $1\times10^{19}$ cm$^{-2}$. Other atoms which allow the p+ type semiconductor layer to be formed may be used as the atoms used for the ion implantation $I_2$.

Next, in the present embodiment, the amorphous semiconductor layer 303 shown in FIG. 3C is annealed at a temperature of 520° C. by using a microwave. This is similar to the first embodiment. This allows the amorphous semiconductor layer 303 to be activated and crystallized, so that the p+ type semiconductor layer 202 is formed from the amorphous semiconductor layer 303 as shown in FIG. 2B. The p+ type semiconductor layer 202 is formed on the light incident surface of the semiconductor detection device (photodiode) 111. In the present embodiment, the frequency of the microwave is set to 5.8 GHz, and the annealing is performed for 20 minutes, similarly to the first embodiment. The crystallization rate of the amorphous semiconductor layer 303 in the present embodiment is, for example, about 1 μm in 30 minutes, similarly to the first embodiment.

Similarly to the first embodiment, the temperature of the annealing is not limited to 520° C., and may be any temperature at which the amorphous semiconductor layer 303 is activated and at which the diffusion of the impurities within the amorphous semiconductor layer 303 does not become problematic. It is desirable that the temperature of the annealing be set, for example, in the range from 250 to 700° C. The time of the annealing is not limited to 20 minutes, and is set in the range from 5 to 60 minutes.

Similarly to the first embodiment, the frequency of the microwave for the annealing is not limited to 5.8 GHz, and may be set to other values. The frequency of the microwave for the annealing is desirably set, for example, in the range from 2.45 to 24.125 GHz in consideration of the ISM bands, and is desirably set, for example, in the range from 3 to 8 GHz in consideration of the heating efficiency of the p+ type semiconductor layer 202.

Thereafter in the present embodiment, as shown in FIG. 2C, color filters 211 and condenser lenses 212 are fabricated on the light incident surface of the semiconductor detection device (photodiode) 111 via the p+ type semiconductor layer 202.

Further, a contact is formed on the interconnect layer $Y_1$ of the peripheral circuit device 112, so that the peripheral circuit device 112 and the metal interconnect 213 are electrically connected so as to extract a signal to the outside. In this way, the back side illuminated CMOS image sensor is manufactured.

As described above, in the present embodiment, the amorphous semiconductor layer 303 is annealed by using the microwave to form the p+ type semiconductor layer (impurity semiconductor layer) 202. Consequently, in the present embodiment, it is possible to form the p+ type semiconductor layer 202 on the semiconductor detection device 111 by the activation heat treatment while reducing the impact on the peripheral circuit device 112.

Further, in the present embodiment, the amorphous semiconductor layer 303 into which the impurities are introduced is formed through the amorphization of the non-amorphous semiconductor layer 301 and the impurity introduction thereinto. Consequently, in the present embodiment, it is possible to form the p+ type semiconductor layer 202 by starting the formation of the p+ type semiconductor layer 202 from the deposition of the non-amorphous semiconductor layer 301.

As described above, according to the embodiments described herein, it is possible to provide a method of manufacturing a back side illuminated imaging device, which makes possible to form the impurity semiconductor layer on the semiconductor detection device by the activation heat treatment while reducing the impact on the peripheral circuit device.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A method of manufacturing a back side illuminated imaging device, the method comprising:
    forming a semiconductor detection device and a peripheral circuit device on a semiconductor substrate;
    bonding the semiconductor substrate onto a holding substrate via the semiconductor detection device and the peripheral circuit device;
    removing the semiconductor substrate from the holding substrate to transfer the semiconductor detection device and the peripheral circuit device onto the holding substrate;
    forming, after transferring the semiconductor detection device and the peripheral circuit device, an amorphous semiconductor layer in which impurities are introduced, on the semiconductor detection device transferred onto the holding substrate; and
    annealing the amorphous semiconductor layer by using a microwave, under a condition that activates the impurities in the amorphous semiconductor layer and crystallizes the amorphous semiconductor layer, to form an impurity semiconductor layer as an inversion layer for the semiconductor device.

2. The method according to claim 1, wherein the annealing is performed at a temperature in a range from 250 to 700° C.

3. The method according to claim 1, wherein a frequency of the microwave is in a range from 2.45 to 24.125 GHz.

4. The method according to claim 3, wherein the frequency of the microwave is in a range from 3 to 8 GHz.

5. The method according to claim 1, wherein the annealing is performed during 5 to 60 minutes.

6. The method according to claim 1, wherein a thickness of the amorphous semiconductor layer is in a range from 15 to 25 nm.

7. The method according to claim 1, wherein an area concentration of the impurities is in a range from $1 \times 10^{18}$ to $1 \times 10^{20}$ cm$^{-2}$.

8. The method according to claim 1, wherein the impurity semiconductor layer comprises a p-type semiconductor layer.

9. The method according to claim 8, wherein the p-type semiconductor layer is formed on a light incident surface of the semiconductor detection device.

10. The method according to claim 9, further comprising:
    fabricating a color filter and a condenser lens on the light incident surface of the semiconductor detection device via the p+ type semiconductor layer.

11. The method according to claim 1, wherein the amorphous semiconductor layer is formed by:
    forming a semiconductor layer on the semiconductor detection device transferred onto the holding substrate;
    amorphizing the semiconductor layer by a first ion implantation into the semiconductor layer; and
    introducing the impurities into the semiconductor layer, by a second ion implantation into the semiconductor layer.

12. The method according to claim 11, wherein
    the semiconductor layer is a silicon layer, and
    atoms used in the first ion implantation are Ge (germanium), Sn (tin), or Sb (antimony) atoms.

13. The method according to claim 11, wherein the semiconductor layer is partially or entirely amorphized by the first ion implantation.

14. The method according to claim 1, wherein the semiconductor detection device comprises a photodiode.

15. The method according to claim 14, wherein the photodiode is formed by:
    forming a p type semiconductor layer on the semiconductor substrate; and
    forming an n type semiconductor layer in the p type semiconductor layer.

16. The method according to claim 1, wherein the peripheral circuit device comprises a field effect transistor.

17. The method according to claim 1, wherein
    the semiconductor substrate is divided along a plane which is parallel to a substrate surface of the semiconductor substrate, before the semiconductor substrate is bonded onto the holding substrate.

18. The method according to claim 1, wherein
    the semiconductor substrate is removed from the holding substrate so that the semiconductor substrate partially remains on the holding substrate.

19. The method according to claim 1, wherein
    the semiconductor substrate is entirely removed from the holding substrate.

20. A method of manufacturing a back side illuminated imaging device, the method comprising:
    forming a semiconductor detection device and a peripheral circuit device on a semiconductor substrate;
    forming, after forming the semiconductor detection device and the peripheral circuit device, an amorphous semiconductor layer in which impurities are introduced, on the semiconductor detection device formed on the semiconductor substrate; and
    annealing the amorphous semiconductor layer by using a microwave, under a condition that activates the impurities in the amorphous semiconductor layer and crystallizes the amorphous semiconductor layer, to form an impurity semiconductor layer as an inversion layer for the semiconductor detection device.

* * * * *